(12) United States Patent
Yamamoto et al.

(10) Patent No.: US 7,022,609 B2
(45) Date of Patent: Apr. 4, 2006

(54) MANUFACTURING METHOD OF A SEMICONDUCTOR SUBSTRATE PROVIDED WITH A THROUGH HOLE ELECTRODE

(75) Inventors: Satoshi Yamamoto, Tokyo (JP); Takashi Takizawa, Tokyo (JP); Tatsuo Suemasu, Tokyo (JP); Masahiro Katashiro, Hachioji (JP); Hiroshi Miyajima, Hachioji (JP); Kazuya Matsumoto, Kamiina-gun (JP); Toshihiko Isokawa, Ina (JP)

(73) Assignees: Fujikura Ltd., Tokyo (JP); Olympus Optical Co., Ltd., Tokyo (JP)

( * ) Notice: Subject to any disclaimer, the term of this patent is extended or adjusted under 35 U.S.C. 154(b) by 261 days.

(21) Appl. No.: 10/646,757

(22) Filed: Aug. 25, 2003

(65) Prior Publication Data

US 2004/0043615 A1    Mar. 4, 2004

(30) Foreign Application Priority Data

Aug. 30, 2002    (JP) .............................. 2002-254858

(51) Int. Cl.
*H01L 21/302*    (2006.01)

(52) U.S. Cl. ...................... 438/694; 438/639; 438/700; 438/702; 438/719; 438/667; 438/695; 216/13; 216/17; 216/19; 29/846; 29/847; 427/96; 427/97; 427/99

(58) Field of Classification Search ............ 427/96, 427/97, 99; 438/702, 667, 694–696, 700, 438/719, 639; 216/19, 13, 17; 29/846, 847
See application file for complete search history.

(56) References Cited

U.S. PATENT DOCUMENTS

| | | | | |
|---|---|---|---|---|
| 5,501,893 A | * | 3/1996 | Laermer et al. ............ | 428/161 |
| 6,239,495 B1 | * | 5/2001 | Sakui et al. ................ | 257/777 |
| 6,756,681 B1 | * | 6/2004 | Hanawa ...................... | 257/774 |
| 6,790,775 B1 | * | 9/2004 | Fartash ....................... | 438/667 |
| 6,856,210 B1 | * | 2/2005 | Zhu et al. ..................... | 333/33 |
| 6,864,172 B1 | * | 3/2005 | Noma et al. ................ | 438/674 |

* cited by examiner

Primary Examiner—Nadine G. Norton
Assistant Examiner—Patricia George
(74) Attorney, Agent, or Firm—Oblon, Spivak, McClelland, Maier & Neustadt, P.C.

(57) ABSTRACT

A manufacturing method of a semiconductor substrate provided with a through hole electrode is proposed. In accordance with the methods, it is possible to effectively form a through hole electrode in a semiconductor substrate in which a device and a wiring pattern have been already fabricated. This manufacturing method includes the steps of forming a first silicon oxide film 12 on a principal surface of the semiconductor substrate 11, forming a small hole 13 through the semiconductor substrate 11 from the opposite the step to reach to the first silicon oxide film 12, covering the inside of the small hole 13 with the second silicon oxide film 14, forming a first thin metal film 15 and a second thin metal film 16 on the first silicon oxide film 12, partially removing the first silicon oxide film 12 corresponding to the end of the small hole 13, and filling the small hole 13 with the conductive material to form a through hole electrode 17.

12 Claims, 5 Drawing Sheets

MANUFACTURING METHOD OF A SEMICONDUCTOR SUBSTRATE PROVIDED WITH A THROUGH HOLE ELECTRODE

CROSS REFERENCE TO RELATED APPLICATIONS

The subject application is related to subject matter disclosed in the Japanese Patent Application No.2002-254858 filed in Aug. 30, 2002 in Japan, to which the subject application claims priority under the Paris Convention and which are incorporated by reference herein.

BACKGROUND OF THE INVENTION

1. Field of the Invention

The present invention relates to a manufacturing method of a semiconductor substrate provided with a through hole electrode.

2. Description of the Related Art

Semiconductor substrates provided with a through hole electrode have been used for electrical connections of various types of electronic devices, optical devices and the like, or as an interposer for three-dimensional (3D) stacked devices.

FIG. 1 is a schematic cross section view showing an example of a semiconductor substrate provided with a through hole electrode.

This semiconductor substrate provided with a through hole electrode is composed of a semiconductor substrate 1 made of a silicon substrate and the like, a small hole 4 formed through the semiconductor substrate 1, an insulating layer 2 formed on the opposites surfaces of the semiconductor substrate 1 and also on the inside surface or side wall of the small hole 4, and a through hole electrode 3 made of a conductive material such as a metal with which the small hole 4 is filled.

With reference to FIG. 2A to FIG. 2C, the manufacturing method of such a semiconductor substrate will be explained as an example of a conventional technique.

First of all, as illustrated in FIG. 2A, the small hole 4 is formed through the semiconductor substrate 1 (a small hole formation step). The small hole 4 can be formed by DRIE (Deep-Reactive Ion Etching) as typified by ICP-RIE (Inductively Coupled Plasma-Reactive Ion Etching), anisotropic etching making use of a potassium hydroxide solution and the like, microscopic machining with a microdrill, Photo Assisted Electro-Chemical Etching, and so forth.

Then, as illustrated in FIG. 2B, the insulating layer 2 is formed on the opposites surfaces of the semiconductor substrate 1 and on the inside surfaces of the small hole 4 (an insulating layer formation step).

Next, as illustrated in FIG. 2C, the small hole 4 is filled with a conductive material such as a metal by a Molten Metal Suction Method, a sputtering method, a plating method, a screen printing method and the like to form a through hole electrode 3.

The semiconductor substrate provided with a through hole electrode manufactured in this manner can be used as an interposer which can be used in 3D stacking as shown in FIG. 3.

As described above, in accordance with the conventional manufacturing method of a semiconductor substrate provided with a through hole electrode, various types of electronic devices and electrical wiring patterns as required are fabricated after forming a through hole electrode in a semiconductor substrate. Because of this, there is restriction in process temperatures as available, when thermal treatments are performed after forming a through hole electrode in a semiconductor substrate, depending upon the properties of the conductive material of the through hole electrode, and therefore the selection of devices and wiring patterns which can be formed thereon is limited.

For example, while sintering is performed at about 400° C. to form the wiring pattern made of aluminum, the through hole electrode may become molten or the properties thereof may be altered by the thermal treatment in the case where the through hole electrode is made of a conductive paste or a eutectic metal such as gold and tin (Au—Sn).

Also, in the case where electric devices are fabricated on the semiconductor substrate provided with a through hole electrode, there are following problems relating to the fabrication process thereof.

In usual cases, from the viewpoint of heavy metal contamination, it is preferable, when possible, not to bring a metal other than a conventional wiring metal such as aluminum in a clean room where electric devices are fabricated. The fabrication process for fabricating electronic devices and electrical wiring patterns in a semiconductor substrate provided with a through hole electrode is not preferred from the viewpoint of controlling contamination because the process are carried out using a plurality of equipments such as a deposition system, a pattern aligner and so forth. If a semiconductor substrate provided with a through hole electrode or a device fabricated thereon is contaminated, the characteristics of not only the semiconductor substrate itself but also of other electric devices having no through hole electrode is deteriorated due to the cross contamination via these equipments. Accordingly, when a through hole electrode is used in an electric device, it is desirable to move the step of forming the through hole electrode to the final stage of the manufacturing method as much as possible.

Moreover, since there are usually formed irregularities of the order of several micrometers on the surface of a through hole electrode, the fabrication process is hampered by the irregularities, depending upon the device to be fabricated. For example, when a resist is coated on a semiconductor substrate provided with a through hole electrode by means of a spin coater, it becomes difficult to form a resist film in a uniform manner in the vicinity of the irregularities on the surface of the through hole electrode.

The present invention has been made in order to solve the shortcomings as described above. It is an object of the present invention therefore to provide a manufacturing method of a semiconductor substrate provided with a through hole electrode wherein it is possible to effectively form a through hole electrode in a semiconductor substrate provided with a device and a wiring pattern.

BRIEF SUMMARY OF THE INVENTION

In order to accomplish the object as described above, a manufacturing method of a semiconductor substrate provided with a through hole electrode, the manufacturing method may comprise: a first insulating layer formation step of forming a first insulating layer on at least one of the principal sides of the semiconductor substrate; a small hole formation step of forming a small hole through the semiconductor substrate from the other principal side of the semiconductor substrate and reaching to the first insulating layer formed in the one principal side of the semiconductor substrate; a second insulating layer formation step of forming a second insulating layer on the inside surface of the small hole; a thin film formation step of forming a thin metal film on the first insulating layer in order that the thin metal film faces an end of the small hole with the first insulating layer intervening therebetween; an insulating layer removing step of removing the first insulating layer at the end of the small hole in order to expose the thin metal film to the inside of the small opening; and a conductive material filling step of filling a conductive material into the small opening in order to form a through hole electrode which is electrically connected to the thin metal film.

Particularly, in an embodiment of the present invention, the thin metal film consists of two layers made of different metals.

Also, in an embodiment of the present invention, the small hole is formed by a Deep-Reactive Ion Etching technique.

Furthermore, in an embodiment of the present invention, a device is formed in the one principal side of the semiconductor substrate, and the second insulating layer is formed also in the other principal side of the semiconductor substrate.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

PREFERRED EMBODIMENTS OF THE INVENTION

In what follows, several embodiments of the present invention will be explained in conjunction with the accompanied drawings.

FIG. 4A through FIG. 4G are cross sectional views showing a first embodiment of the method of manufacturing a semiconductor substrate provided with a through hole electrode in accordance with the present invention; the views are arranged in the order of manufacturing. The cross section is normal to the semiconductor substrate and along the longitudinal direction of the through hole electrode. FIG. 5A and FIG. 5B are plan views showing the semiconductor substrate provided with a through hole electrode as seen from the above.

In this embodiment, an interposer which can be used for 3D stacking is manufactured.

Figure 1:
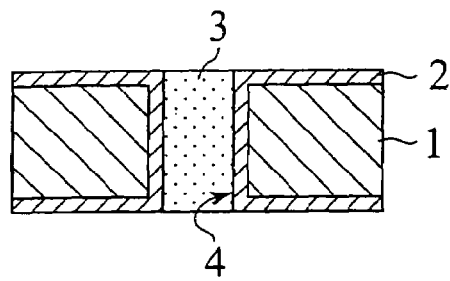
FIG. 1 is a schematic cross section view showing an example of a semiconductor substrate provided with a through hole electrode.
Figure 2A:
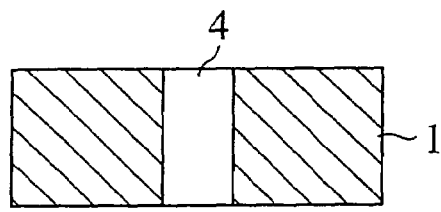
FIG. 2A to FIG. 2C are explanatory views for explaining a conventional manufacturing method of a semiconductor substrate provided with a through hole electrode.
Figure 2B:
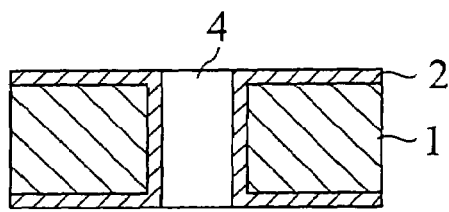
Figure 2C:
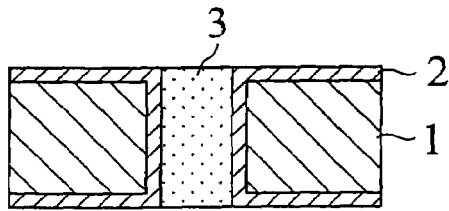
Figure 3:
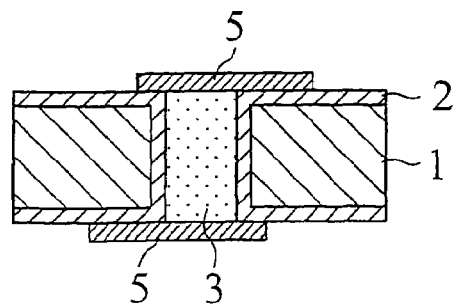
FIG. 3 is a schematic cross section view showing another example of a semiconductor substrate provided with a through hole electrode.
Figure 4A:
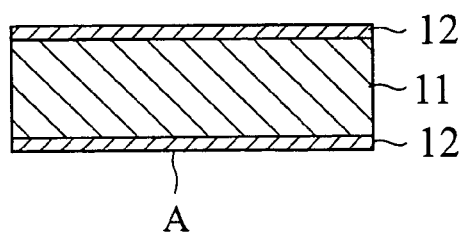
FIG. 4A through FIG. 4G are cross sectional views showing a first embodiment of the method of manufacturing a semiconductor substrate provided with a through hole electrode in accordance with the present invention.
Figure 5A:
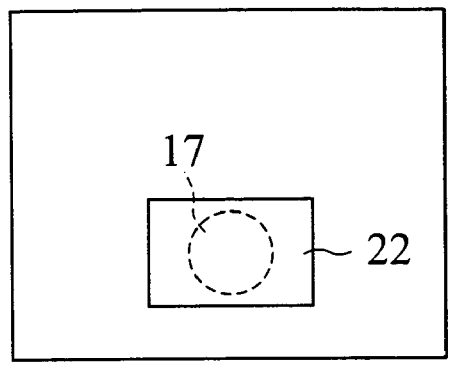
FIG. 5A and FIG. 5B are plan views showing the semiconductor substrate as seen from the above.
Figure 5B:
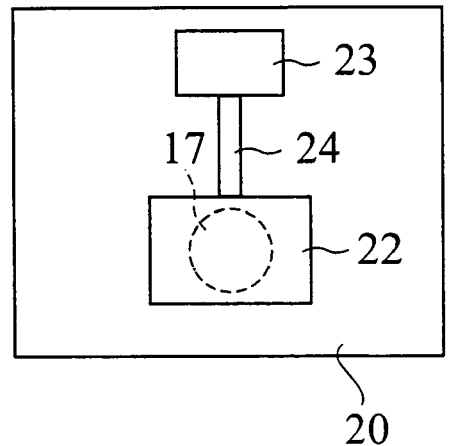

As illustrated in FIG. 4A, a semiconductor substrate 11 made of a silicon substrate having a thickness of 300 μm or thereabout is prepared, and a first silicon oxide films 12 (acting as insulating layer) having a thickness of 1 μm or the like are formed on both the upper and lower surfaces (principal surfaces) of the substrate 11 (a first insulating layer formation step). In this embodiment, the first silicon oxide film 12 is formed, for example, by thermal oxidation at 1000° C. for four hours.

The first silicon oxide film 12 can be formed also by a plasma CVD technique, a sputtering technique or the like, instead of thermal oxidation, in accordance with the film thickness of the silicon oxide film and/or the application as desired.

In this embodiment, a silicon substrate is used as the semiconductor substrate 11, and thus it is possible to easily form the first silicon oxide film 12 as an insulating layer by thermal oxidation or the like.

In addition to this, the usage of a silicon substrate makes it possible to form a small hole (see below) with precision as required in the surface of the semiconductor substrate 11 by DRIE (Deep-Reactive Ion Etching) to be hereinafter described.

Also, with the first silicon oxide film 12, the semiconductor substrate 11 is insulated from a thin metal film, which is to be formed in a later step. Thus, by patterning this thin metal film in accordance with a desired profile, it is possible to make use of this thin metal film as a wiring pattern between the through hole electrode and electric devices to be stacked on the semiconductor substrate 11.

Furthermore, the first silicon oxide film 12 functions as an etching stop layer when the small hole is formed by a DRIE technique (as described below), and therefore it is possible to uniformly form the small hole in the surface of the semiconductor substrate 11. Moreover, the first silicon oxide film 12 can be selectively removed by selecting an appropriate etching gas (as described below). In this case, the thin metal film (hereinafter described) can serve as an etching stopper layer. As a result, it is possible to form a desired small hole just below the thin metal film by consecutive manufacturing steps.

Figure 4E:
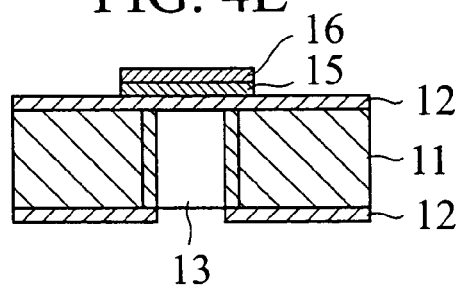
Figure 4B:
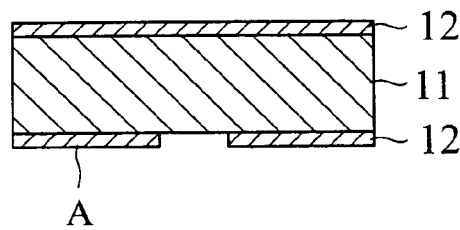

More specifically, as illustrated in FIG. 4B, the first silicon oxide film 12 on the lower surface A of the substrate 11 is partially removed at a location where the through hole electrode is to be formed.

Figure 4F:
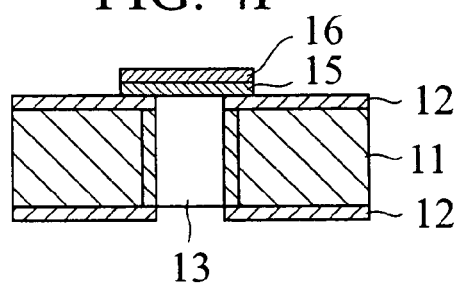
Figure 4C:
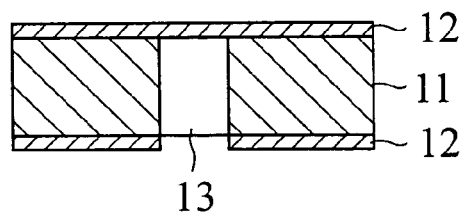

Next, as illustrated in FIG. 4C, a small hole 13 is formed through the semiconductor substrate 11 from the lower surface (principal surface) A to the first silicon oxide film 12 formed on the upper surface (other principal surface) by a deep-reactive ion etching method (in a small hole formation step). The deep-reactive ion etching method (DRIE) is performed by alternately performing an etching process with sulfur hexafluoride (SF6) or the like and forming passivation films on the side wall of the small hole 13 (as the Bosch process) in order to deeply etch the semiconductor substrate 11.

The cross section of the small hole 13 in the plane perpendicular to the depth direction may have any profile such as a circle, an ellipse, a triangle, a square, a rectangle and so forth and may have any appropriate area or extension depending upon the size, conductivity (resistance) and the like property of the desired semiconductor substrate provided with a through hole electrode.

With the DRIE technique, it is possible to easily perform microscopic machining of the small hole 13. Also, by appropriately selecting a semiconductor substrate and an etching gas, forming the small hole 13 and removing the first silicon oxide film 12 just below a thin metal film (as described later) are performed consecutively and the small hole 13 are formed effectively.

Figure 4G:
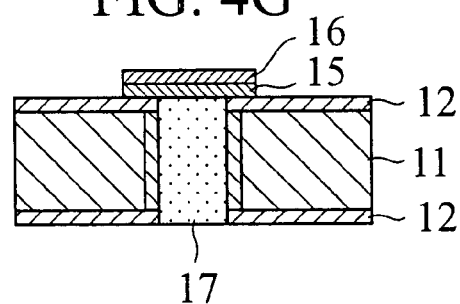
Figure 4D:
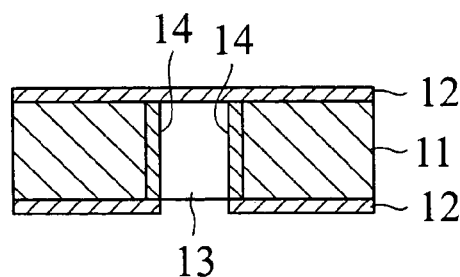

Next, as illustrated in FIG. 4D, a second silicon oxide film 14 having a thickness of 1 μm or thereabout is formed on the inside surfaces of the small hole 13 (a second insulating layer formation step). In this embodiment, the second silicon oxide film 14 is formed, for example, by thermal oxidation at 1000° C. for four hours.

The second silicon oxide film 14 can be formed also by a plasma CVD technique, a sputtering technique or the like, instead of thermal oxidation, in accordance with the film thickness of the silicon oxide film and/or the use application thereof as desired.

With the silicon oxide film 14, the semiconductor substrate 11 is insulated from a conductive material that is filled into the small hole 13 in a later step.

Next, as illustrated in FIG. 4E, a first thin metal film 15 and a second thin metal film 16 made of different materials are formed on the first silicon oxide film 12 at least in a location just above the small hole 13 (a thin film formation step). In this embodiment, the first thin metal film 15 and the second thin metal film 16 is formed for example by a sputtering technique.

As illustrated in FIG. 5A, if necessary, it is possible to form an electrode pad 22 on the through hole electrode 17 by patterning the thin metal films. Likewise, as illustrated in FIG. 5B, it is also possible to form another electrode pad 23 and wiring patterns 24 for interconnecting these electrode pads on the substrate 20. Referring again to FIG. 4E, the first thin metal film 15 is made of an aluminum silicon (Al—Si) thin film while the second thin metal film 16 is made of an aluminum (Al) thin film in this embodiment.

The first thin metal film 15 and the second thin metal film 16 may be made of other metallic materials. For example, in order to improve the adhesiveness of the first thin metal film 15 to the through hole electrode 17, the first thin metal film 15 can be formed by suitably selecting the metallic material from among gold, platinum, titanium, silver, copper, bismuth, tin, nickel, chromium, zinc, and other suitable metals and combinations thereof depending upon the type of the conductive material with which the small hole 13 is filled. Also, in order to improve the adhesiveness of the second thin metal film 16 to a solder bump, which may be formed on a chip to be stacked, the second thin metal film 16 can be formed by selecting the metallic material from among gold, platinum, titanium, silver, copper, bismuth, tin, nickel, chromium, zinc, and other suitable metals and combinations thereof depending upon the type of the solder bump. Furthermore, while the thin metal film formed on the semiconductor substrate 11 is a dual layered structure composed of the first thin metal film 15 and the second thin metal film 16 in this embodiment, the present invention is not limited thereto and it is possible to form the thin metal film in a multiple layered structure made of three or more layers of different metals.

By forming the thin metal film on the semiconductor substrate 11 in a multiple layered structure made of two or more layers of different metals, it is possible to improve the adhesiveness of the thin metal film to the conductive material that fills the small hole 13 and therefore possible to improve the reliability of the electrical connection between the through hole electrode 17 and the thin metal film (the first thin metal film 15 and the second thin metal film 16 in this case).

Next, as illustrated in FIG. 4F, the first silicon oxide film 12 is partially removed only at the upper end of the small hole 13 just below the first thin metal film 15 by etching (an insulating layer removing step). Then, the first thin metal film 15 is exposed to the inside of the small hole 13. In this embodiment, the first silicon oxide film 12 is etched by an RIE (Reactive Ion Etching) technique (as a dry etching) by the use of carbon tetrafluoride (CF4) (as etchant gas).

Next, as illustrated in FIG. 4G, a conductive material is filled into the small hole 13 by a Molten Metal Suction Method or a screen printing method to form a through hole electrode 17 (a conductive material filling step).

With this process, the first thin metal film 15 and the second thin metal film 16 are electrically connected to the through hole electrode 17.

In the Molten Metal Suction Method, a molten metal is filled into the hole by dipping the semiconductor substrate in a molten metal bath in vacuo and then increasing the pressure (decreasing the degree of vacuum or increasing the pressure to the atmospheric pressure). The conductive material may be made of a eutectic composition of 80% by weight of gold (Au) and 20% by weight of tin (Sn). In this method, it is possible to effectively fill the small hole 13 with the conductive material even if the small hole 13 is microscopic. Also, the small hole 13 is completely filled with the conductive material through the deep end of the small hole 13, so that the first thin metal film 15 and the second thin metal film 16 are electrically connected to the through hole electrode 17 without fail.

Although the small hole 13 may be filled with the conductive material made of a eutectic composition of 80% by weight of gold and 20% by weight of tin in this embodiment, the present invention is not limited thereto. For example, the conductive material can be made of a different composition of a gold-tin alloy, a metal such as tin and indium, or a solder such as a tin-lead base solder, an indium base solder, a tin base solder, a lead base solder, a gold base solder, aluminum base solder and the like.

When the conductive material is filled by a screen printing method, a copper (Cu) paste is filled into the small hole 13. In this case, even if the area of the semiconductor substrate 11 is large, it is possible to effectively and uniformly fill the small hole 13 with the conductive material. Furthermore, the small hole 13 is completely filled with the conductive material through the deep end of the small hole 13 so that the first thin metal film 15 and the second thin metal film 16 are electrically connected to the through hole electrode 17 without fail.

In the screen printing method, the small hole 13 may be filled with a copper paste as the conductive material. However, the present invention is not limited thereto. Another conductive paste such as a silver paste, a carbon paste, a gold-tin paste and the like can be used as the conductive material.

Figure 6A:
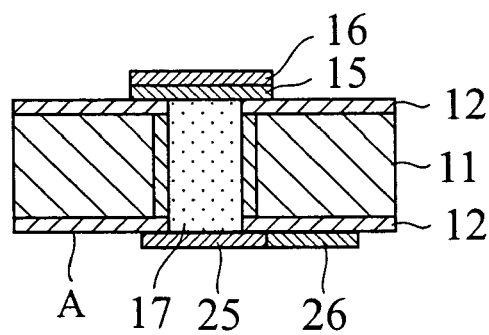
FIG. 6A and FIG. 6B are schematic cross section views showing the semiconductor substrate obtained by the first embodiment of the manufacturing method in accordance with the present invention.
Figure 6B:
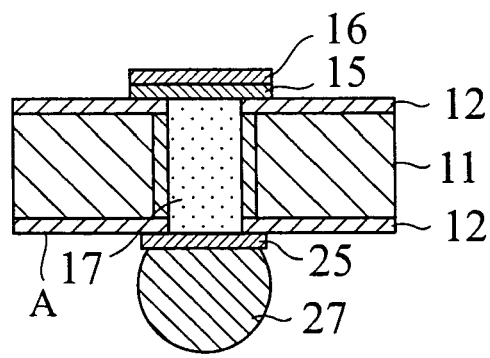

As illustrated in FIG. 6A, an electrode pad 25 and a wiring pattern 26 may be formed on one of the principal surfaces A of the semiconductor substrate obtained by this embodiment. Also as illustrated in FIG. 6B, a metallic bump 27 may be further formed on the electrode pad 25.

In the semiconductor substrate provided with a through hole electrode, the opposite surfaces thereof can be electrically connected with each other by means of the through hole electrode 17 so that it is possible to make use of the semiconductor substrate as an interposer 4 which can be used for 3D stacking.

With reference to FIG. 7A to FIG. 7F and FIG. 8A to FIG. 8B, a second embodiment of the manufacturing method in accordance with the present invention will be explained.

In this embodiment, a semiconductor device provided with a through hole electrode is manufactured. Specifically, a through hole electrode is formed through a semiconductor substrate on which a general purpose IC chip for driving and controlling MEMS (Micro Electro Mechanical Systems) or other MEMS devices such as a sensor are provided.

FIG. 7A through FIG. 7F are cross sectional views of a semiconductor device showing the method of this embodiment and arranged in order of manufacturing. The cross section is normal to the plane of the semiconductor substrate and along the longitudinal direction of the through hole electrode. FIG. 8A and FIG. 8B are plan views showing the semiconductor device provided with a through hole electrode as seen from the above.

Figure 7A:
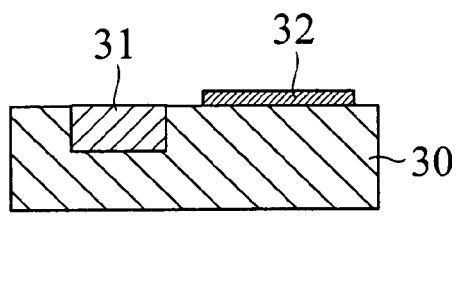
FIG. 7A through FIG. 7F are cross sectional views showing a second embodiment of the method of manufacturing a semiconductor device provided with a through hole electrode in accordance with the present invention.
Figure 8A:
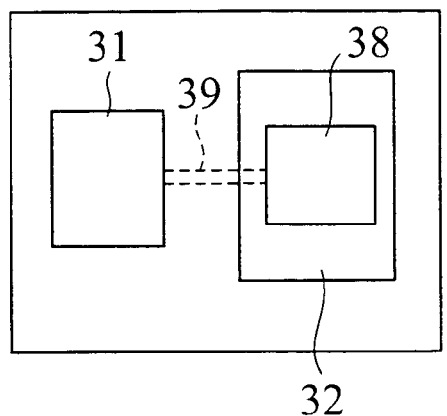
FIG. 8A and FIG. 8B are plan views showing the semiconductor device as seen from the above.
Figure 8B:
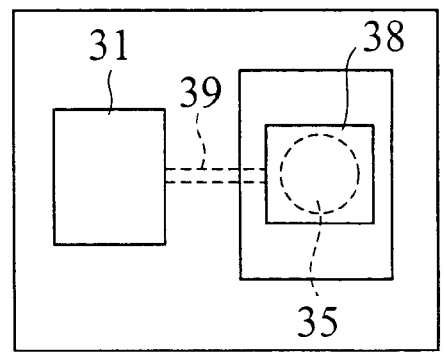

As illustrated in FIG. 7A, a first silicon oxide film 32 having a thickness of 1 µm or thereabout is first formed in a position of semiconductor substrate 30 (a first insulating layer formation step); an electronic device 31 is formed on the upper surface (the principal surface) of semiconductor substrate 30. The semiconductor substrate is made of a silicon substrate having a thickness of 300 µm or thereabout. The first silicon oxide film 32 acts as an insulating layer on the upper surface (a principal surface) of the semiconductor substrate 30. In this embodiment, the first silicon oxide film 32 is formed, for example, by plasma CVD technique with tetra-ethoxy-silane (TEOS). As described below, a through hole electrode is formed in the substrate 30 below the film 32 in a later step.

The first silicon oxide film 32 may be formed also by plasma CVD technique with silane (SiH4) instead of TEOS. Also, it is possible to employ another film formation technique such as a sputtering technique, a thermal oxidation technique or the like to cause no damage to the electronic device 31 during processing.

In this embodiment, a silicon substrate is used as the semiconductor substrate 30, and therefore it is possible to easily form the first silicon oxide film 32 acting as an insulating layer by a plasma CVD technique or the like. In addition to this, by making use of a silicon substrate, it is possible to form a small hole to be hereinafter described with precision as required in the surface of the semiconductor substrate 30 by a DRIE technique.

Also, the first silicon oxide film 32 insulates the semiconductor substrate 30 from a thin metal film, which is to be formed in a later step. Thus, it is possible to make use of such thin metal film as a wiring pattern between a through hole electrode and electric devices fabricated on the semiconductor substrate 30. The electric devices may be formed by patterning the thin metal film in a desired profile.

Furthermore, as described below, the first silicon oxide film 32 can be used as an etching stop layer when a small hole is formed by a DRIE technique, so that it is possible to uniformly form the small hole in the semiconductor substrate 30. Further, the first silicon oxide film 32 above the small hole can be selectively removed by selecting an appropriate etching gas as described below. In this case, the thin metal film can serve as an etching stopper layer. Thus it is possible to form a desired small hole just below the thin metal film consecutively.

Figure 7D:
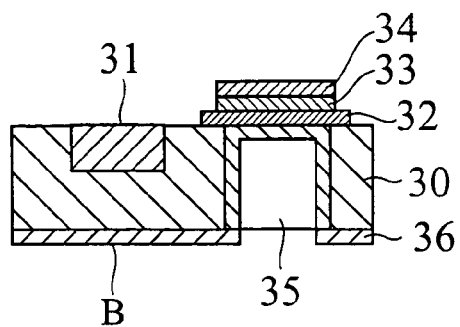
Figure 7B:
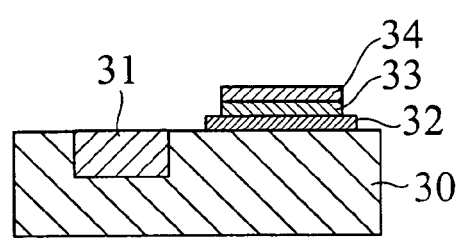

More specifically, as illustrated in FIG. 7B, a first thin metal film 33 and a second thin metal film 34 of different materials are formed at least on the first silicon oxide film 32 (a thin film formation step). In this embodiment, the first thin metal film 33 and the second thin metal film 34 are formed for example by a sputtering technique. The first thin metal film 33 may be made of an aluminum silicon thin film while the second thin metal film 34 is made of an aluminum thin film.

As illustrated in FIG. 8A, it is possible to form an electrode pad 38 and a wiring pattern 39 by pattering the thin metal films; the wiring pattern 39 connects the electronic device 31 and the electrode pad 38. The electrode pad 38 and the wiring pattern 39 may be formed simultaneously.

Referring again to FIG. 7B, the first thin metal film 33 is made of an aluminum silicon thin film while the second thin metal film 34 is made of an aluminum thin film in this embodiment; however, the present invention is not limited thereto. For example, in order to improve the adhesiveness of the first thin metal film 33 to the through hole electrode 37 (see below), the first thin metal film 33 can be formed by suitably selecting the metallic material from among gold, platinum, titanium, silver, copper, bismuth, tin, nickel, chromium, zinc, and other suitable metals and combinations thereof depending upon the type of the conductive material with which a small hole is to be filled. Also, the second thin metal film 34 can be formed by selecting the metallic material from among gold, platinum, titanium, silver, copper, bismuth, tin, nickel, chromium, zinc, and other suitable metals and combinations thereof. Furthermore, while the thin metal film formed on the semiconductor substrate 30 is a dual layered structure composed of the first thin metal film 33 and the second thin metal film 34 in this embodiment, the present invention is not limited thereto so that it is possible to form the thin metal film in a multiple layered structure made of three or more layers of different metals.

By forming the thin metal film on the semiconductor substrate 30 in a multiple layered structure made of two or more layers of different metals, it is possible to further improve the adhesiveness of the thin metal film to the conductive material with which the small hole is filled and therefore possible to improve the reliability of the electrical connection between the through hole electrode and the thin metal film (the first thin metal film 33 and the second thin metal film 34 in this embodiment).

Figure 7E:
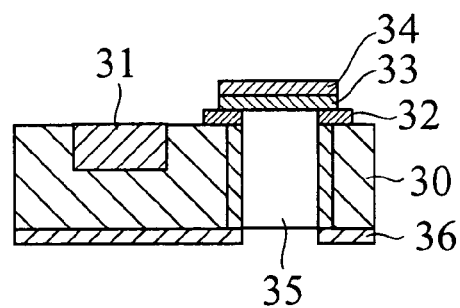
Figure 7C:
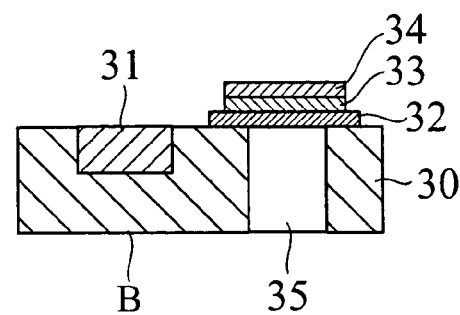

As illustrated in FIG. 7C and FIG. 8B, a small hole 35 is formed by a DRIE technique from the lower surface (principal surface) B of the semiconductor substrate 30 opposite to the upper surface (principal surface) of the semiconductor substrate 30 where the electronic device 31 and the electrode pad 38 are formed (small hole formation step). The small hole 35 is located in a position below the electrode pad 38 and vertically extends to the first silicon oxide film 32.

The cross section of the small hole 35 in the plane perpendicular to the depth direction may have any profile such as a circle, an ellipse, a triangle, a square, a rectangle and so forth and may have any appropriate area or extension depending upon the size, conductivity (resistance) and the like property of the desired semiconductor substrate provided with a through hole electrode.

With the DRIE technique, it is possible to easily perform microscopic machining of the small hole 35. Also, by appropriately selecting a semiconductor substrate and an etching gas, forming the small hole 35 and removing a second silicon oxide film just below the thin metal films 33, 34 can be performed consecutively as described below. Resultantly, the forming the small hole 35 can be made efficiently.

As illustrated in FIG. 7D, a second silicon oxide film 36 having a thickness of 1 μm or thereabout is formed on the lower surface (other principal surface) B of the semiconductor substrate 30, the inside surface of the small hole 35 and the lower surface of the silicon oxide film 32 (a second insulating layer formation step). In this embodiment, the second silicon oxide film 36 is formed, for example, by plasma CVD technique with tetra-ethoxy-silane (TEOS).

The second silicon oxide film 36 can be formed also by plasma CVD technique with silane (SiH4) instead of TEOS. Also, it is possible to employ another film formation technique such as a sputtering technique, a thermal oxidation technique or the like to avoid damages to the electronic device 31 during processing.

As illustrated in FIG. 7E, the first and second silicon oxide films 32, 36 above the small hole 35 are etched and removed so as to expose the first thin metal film 33 to the small hole 35 (an insulating layer removing step). To remove only the silicon oxide films 32, 36 above the small hole 35, an anisotropic etching process is used while protecting the silicon oxide film on the lower surface of the substrate 30 by resist material. In this embodiment, for example, the first and second silicon oxide films 32, 36 are etched by an RIE (Reactive Ion Etching) technique (as a dry etching) by the use of carbon tetrafluoride (CF4) (as an etchant gas).

Figure 7F:
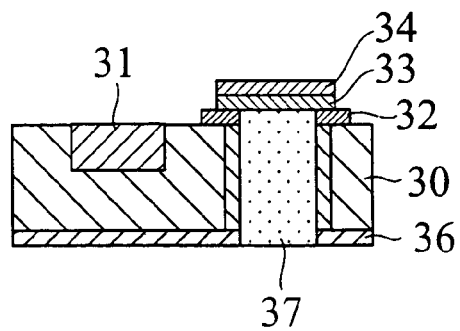

Next, as illustrated in FIG. 7F, a conductive material is filled into the small hole 35 by a Molten Metal Suction Method or a screen printing technique in order to form a through hole electrode 37 (a conductive material filling step).

With this process, the first thin metal film 33 and the second thin metal film 34 are electrically connected to the through hole electrode 37.

In the Molten Metal Suction Method, the conductive material may include a eutectic composition of 80% by weight of gold and 20% by weight of tin. On the other hand, when a screen-printing technique is used, the small hole 35 may be filled with a copper paste. When the conductive material is filled by a Molten Metal Suction Method, it is possible to effectively fill the small hole 35 with the conductive material even if the size of the small hole 35 is microscopic. Also, the small hole 35 is completely filled with the conductive material through the deep end of the small hole 35 so that the first thin metal film 33 and the second thin metal film 34 are electrically connected to the through hole electrode 37 without fail.

Although the small hole 35 is filled with the conductive material made of a eutectic composition of 80% by weight of gold and 20% by weight of tin in this embodiment of the Molten Metal Suction Method, the present invention is not limited thereto. For example, the conductive material can be made of a different composition of a gold-tin alloy, a metal such as tin and indium, or a solder such as a tin-lead base solder, a tin base solder, a lead base solder, a gold base solder, an indium base solder, aluminum base solder and the like.

In the case where the conductive material is filled into the small hole 35 by printing, a copper (Cu) paste may be used to fill the small hole 35. In this case, even if the area of the semiconductor substrate 30 is large, it is possible to effectively and uniformly fill the small hole 35 with the conductive material. Furthermore, since the small hole 35 is completely filled with the conductive material through the deep end of the small hole 35, the first thin metal film 33 and the second thin metal film 34 is electrically connected to the through hole electrode 37 without fail, so that the through hole electrode 37 securely serves as an electrode.

In the case where the conductive material is filled by a printing method, the small hole 35 may be filled with a copper paste as the conductive material. However, the present invention is not limited thereto. Another conductive paste such as a silver paste, a carbon paste, a gold-tin paste and the like can be used as the conductive material for this purpose.

Figure 9A:
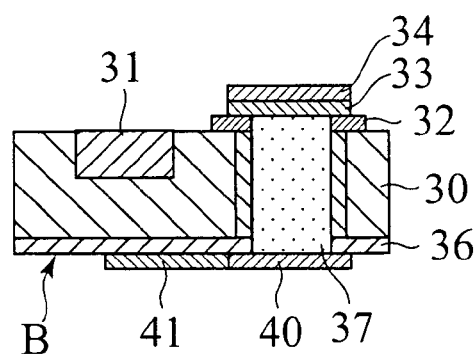
FIG. 9A and FIG. 9B are schematic cross section views showing the semiconductor substrate obtained by the manufacturing method in accordance with the present invention.
Figure 9B:
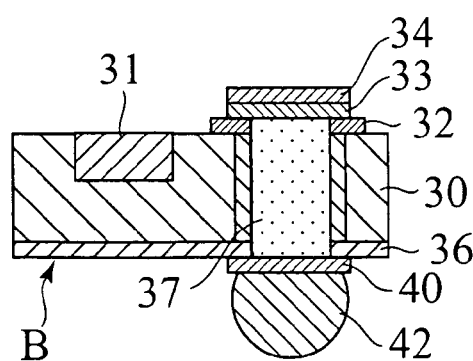

In the semiconductor device obtained by this embodiment, an electrode pad 40 and a wiring pattern 41 as illustrated in FIG. 9A may be formed on the lower surface (other principal surface) B of the semiconductor substrate. Also, in addition to this, a metallic bump 42 as illustrated in FIG. 9B may be formed on the electrode pad 40.

Also, in the semiconductor device as obtained by this embodiment, the opposite surfaces are connected to each other by means of the through hole electrode 37 so that it is possible to achieve 3D chip stacking.

Furthermore, in the semiconductor device described above, the electronic device 31 and the through hole electrode 37 are electrically connected to each other by patterning the first thin metal film 33 or the second thin metal film 34 to form the electrode pad 38 and the wiring pattern 39 at the same time. However, the present invention is not limited thereto. For example, it is possible to connect the electronic device 31 to the electrode pad 38 by wire bonding with a metallic wire.

As explained above, in the manufacturing method in accordance with the embodiments as explained above, a through hole electrode is efficiently formed through a semiconductor substrate on which an electronic device(s) or a wiring pattern have been fabricated and therefore it is possible to easily manufacture a semiconductor substrate provided with a through hole electrode and a semiconductor device provided with a through hole electrode.

The foregoing description of the embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of manufacturing a semiconductor substrate provided with a through hole electrode by which first and second principal sides of said semiconductor substrate communicate with each other, said manufacturing method comprising:
    (a) forming a first insulating layer on a first principal side of said semiconductor substrate;
    (b) forming a hole through said semiconductor substrate extending from the second principal side of said semiconductor substrate and to said first insulating layer;
    (c) forming a second insulating layer on the inside surface of said hole;
    (d) forming a metal film on said first insulating layer;

(e) removing a portion of said first insulating layer between said metal film and said hole in order to expose said metal film to said hole; and (f) filling a conductive material into said hole in order to form a through hole electrode which is electrically connected to said metal film.

2. The manufacturing method of a semiconductor substrate as set forth in claim 1 wherein said thin metal film includes two layers made of different metals.

3. The manufacturing method of claim 1, wherein the steps are carried out in the order of (a), (b), (c), (d), (e) and (f).

4. The manufacturing method of claim 1, wherein an insulating layer is formed on the second principal side of the substrate at the step (a).

5. The manufacturing method of claim 1, wherein an insulating layer is formed on the second principal side of the substrate at the step (c).

6. The manufacturing method of a semiconductor substrate as set forth in claim 1 wherein said hole is formed by a Deep-Reactive Ion Etching technique.

7. The manufacturing method of a semiconductor substrate as set forth in claim 6 wherein said metal film includes two layers made of different metals.

8. The manufacturing method of a semiconductor substrate as set forth in claim 1 wherein a device is formed in said first principal side of said semiconductor substrate and wherein said second insulating layer is further formed in the second principal side of said semiconductor substrate.

9. The manufacturing method of a semiconductor substrate as set forth in claim 8 wherein said metal film includes two layers made of different metals.

10. The manufacturing method of claim 8, wherein the steps are carried out in the order of (a), (d), (b), (c), (e) and (f).

11. The manufacturing method of a semiconductor substrate as set forth in claim 8 wherein said hole is formed by a Deep-Reactive Ion Etching technique.

12. The manufacturing method of a semiconductor substrate as set forth in claim 11 wherein said metal film includes two layers made of different metals.

* * * * *